(12) United States Patent
Mack et al.

(10) Patent No.: US 12,241,945 B2
(45) Date of Patent: Mar. 4, 2025

(54) FRANGIBLE ANTENNA MOUNT ELECTRICAL INTERCONNECT FOR AIRCRAFT COMPONENTS, WITH BREAK DETECTION

(71) Applicant: The Boeing Company, Chicago, IL (US)

(72) Inventors: Torsten Mack, Portland, OR (US); Douglas Allyn Miller, Sisters, OR (US)

(73) Assignee: The Boeing Company, Arlington, VA (US)

( * ) Notice: Subject to any disclaimer, the term of this patent is extended or adjusted under 35 U.S.C. 154(b) by 199 days.

(21) Appl. No.: 18/059,100

(22) Filed: Nov. 28, 2022

(65) Prior Publication Data

US 2024/0175940 A1 May 30, 2024

(51) Int. Cl.
| | |
|---|---|
| *G01R 31/54* | (2020.01) |
| *B64U 70/30* | (2023.01) |
| *G01D 3/08* | (2006.01) |
| *H01Q 1/28* | (2006.01) |

(52) U.S. Cl.
CPC ............... *G01R 31/54* (2020.01); *G01D 3/08* (2013.01); *H01Q 1/28* (2013.01); *B64U 70/30* (2023.01)

(58) Field of Classification Search
CPC . G01R 31/54; G01D 3/08; H01Q 1/28; B64U 70/30
See application file for complete search history.

(56) References Cited

U.S. PATENT DOCUMENTS

| | | | |
|---|---|---|---|
| 5,886,875 A | 3/1999 | Phelps, III et al. | |
| 8,136,766 B2 | 3/2012 | Dennis | |
| 11,967,818 B1 * | 4/2024 | Maharjan | B64D 31/16 |
| 2002/0011861 A1 * | 1/2002 | Nishikawa | G01R 1/06794 |
| | | | 324/750.17 |
| 2006/0186902 A1 * | 8/2006 | Mikael | G01N 27/041 |
| | | | 324/697 |
| 2013/0049769 A1 * | 2/2013 | Grimm | H01Q 1/425 |
| | | | 324/649 |
| 2019/0168872 A1 * | 6/2019 | Grubb | B64F 5/10 |
| 2020/0070973 A1 * | 3/2020 | Grubb | B64C 25/68 |
| 2023/0025116 A1 * | 1/2023 | Zhao | H01R 13/6691 |
| 2023/0323908 A1 * | 10/2023 | Lynch | F16B 19/1081 |
| | | | 411/44 |
| 2023/0356681 A1 * | 11/2023 | Lohe | B60L 3/0046 |

* cited by examiner

*Primary Examiner* — Akm Zakaria
(74) *Attorney, Agent, or Firm* — Harrity & Harrity, LLP (57) ABSTRACT

Systems, apparatuses and methods may provide for a frangible sensor assembly that includes a circuit board having a retained section, a frangible portion, and a detachable section separated from the retained section by the frangible portion, a conductive element on the retained section that spans the frangible portion, and a sensor sub-assembly electrically coupled to the conductive element. The sensor sub-assembly monitors a continuity signal via the conductive element, detects a break of the frangible portion based on the continuity signal, and generates an alert notification in response to the break of the frangible portion.

20 Claims, 6 Drawing Sheets

Monitor a continuity signal via a conductive element, wherein the conductive element is on a retained section of a circuit board and spans a frangible portion of the circuit board, ad wherein a detachable portion of the circuit board is separated from the retained section by a frangible portion ⟶ 132

Detect a break of the frangible portion based on the continuity signal

134

Generate an alert notification in response to the break of the frangible portion

FRANGIBLE ANTENNA MOUNT ELECTRICAL INTERCONNECT FOR AIRCRAFT COMPONENTS, WITH BREAK DETECTION

TECHNICAL FIELD

Embodiments generally relate to electrical interconnects. More particularly, embodiments relate to break detection technology in frangible antenna mounts and electrical interconnects of aircraft components.

BACKGROUND

Unmanned aerial vehicles (UAVs, e.g., drones) are typically useful in surveillance and other missions. The recapture of a UAV may involve attaching a hook to a wing of the UAV and flying the hook into a rope recovery system. Often, the rope entanglement breaks winglets free from the wing. While frangible wing bolts between the wing and the winglet may be used to reduce structural damage to the wing, damage to electrical and radio frequency (RF) components within the wing and/or winglet may still occur. Indeed, the electrical/RF damage may go unnoticed until after the UAV is launched on a subsequent mission, which may jeopardize the subsequent mission.

SUMMARY

In accordance with one or more embodiments, an unmanned aerial vehicle (UAV) comprises a fuselage and a plurality of wings, at least one of the plurality of wings including a frangible sensor assembly comprising a circuit board including a retained section, a frangible portion, and a detachable section separated from the retained section by the frangible portion, a conductive element on the retained section that spans the frangible portion, and a sensor sub-assembly electrically coupled to the conductive element, wherein the sensor sub-assembly is to monitor a continuity signal via the conductive element, detect a break of the frangible portion based on the continuity signal, and generate an alert notification in response to the break of the frangible portion.

In accordance with one or more embodiments, a frangible sensor assembly comprises a circuit board including a retained section, a frangible portion, and a detachable section separated from the retained section by the frangible portion, a conductive element on the retained section that spans the frangible portion, and a sensor sub-assembly electrically coupled to the conductive element, wherein the sensor sub-assembly is to monitor a continuity signal via the conductive element, detect a break of the frangible portion based on the continuity signal, and generate an alert notification in response to the break of the frangible portion.

In accordance with one or more embodiments, at least one computer readable storage medium comprises a set of instructions, which when executed by a processor, cause the processor to monitor a continuity signal via a conductive element, wherein the conductive element is on a retained section of a circuit board and spans a frangible portion of the circuit board, and wherein a detachable section of the circuit board is separated from the retained section by the frangible portion, detect a break of the frangible portion based on the continuity signal, and generate an alert notification in response to the break of the frangible portion.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Figure 1:
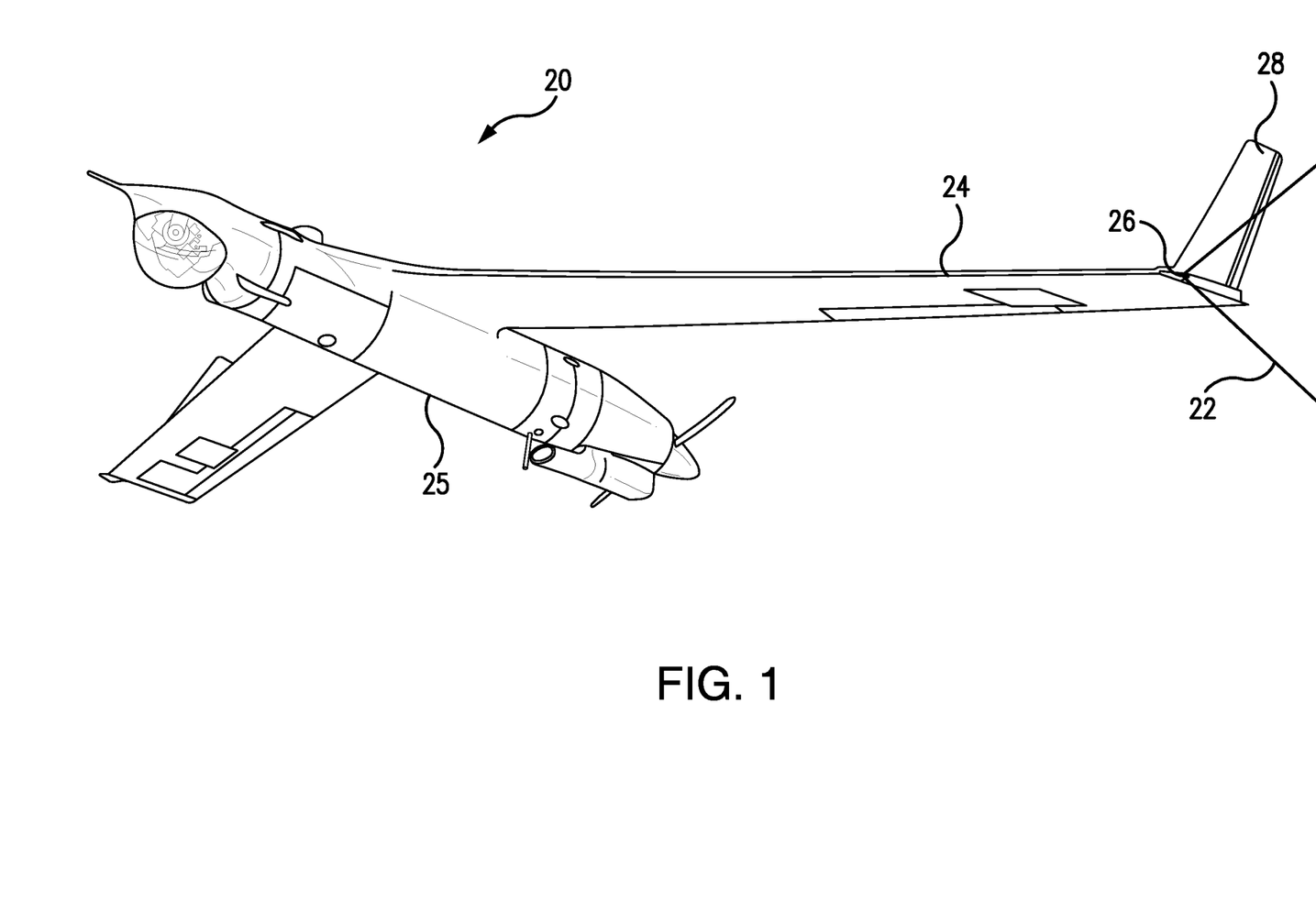
FIG. 1 is a perspective view of an example of a UAV recovery operation according to an embodiment.

Turning now to FIG. 1, the recovery of an unmanned aerial vehicle (UAV) 20 is shown in which a wing 24 is coupled to a fuselage 25 of the UAV 20 and a hook 26 is mounted to the wing 24 of the UAV 20. In the illustrated example, the hook 26 is flown into a rope 22, which halts (e.g., snags) the trajectory of the UAV 20. Due to the speed at which the UAV 20 is traveling during the recovery operation and the forces applied to the wing 24, a winglet 28 and/or other portions of the UAV 20 may break free. Moreover, electrical and radio frequency (RF) components within the wing 24 and/or the winglet 28 may also be damaged as a result of the recovery operation. Technology described herein provides for a frangible sensor assembly that detects electrical damage resulting from the recovery operation and automatically generates an alert notification (e.g., maintenance alert, in-flight alert) in response to the damage.

Figure 2A:
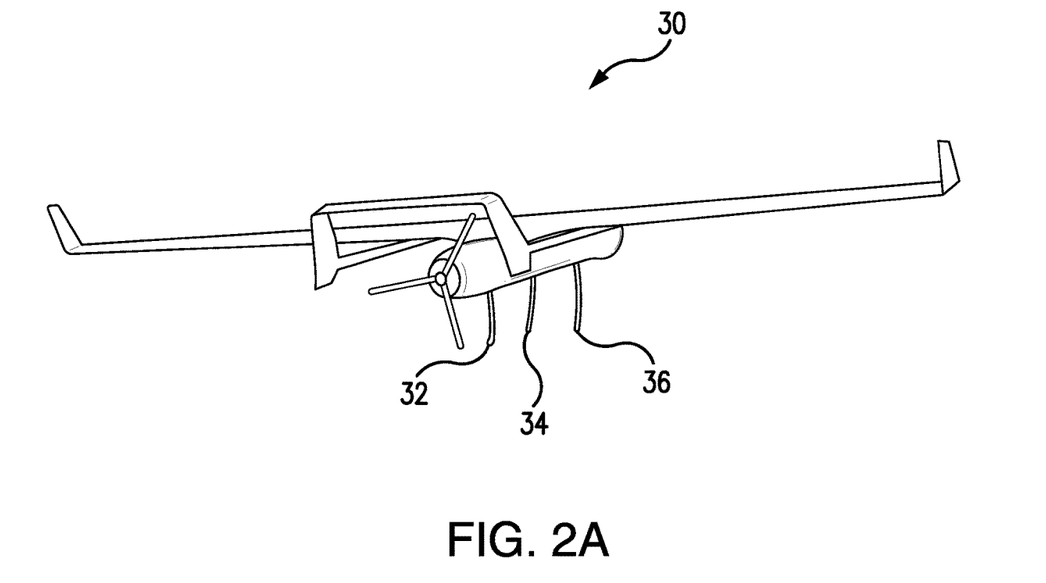
FIGS. 2A-2C are perspective views of examples of antennas mounted underneath an airframe structure according to embodiments.
Figure 2B:
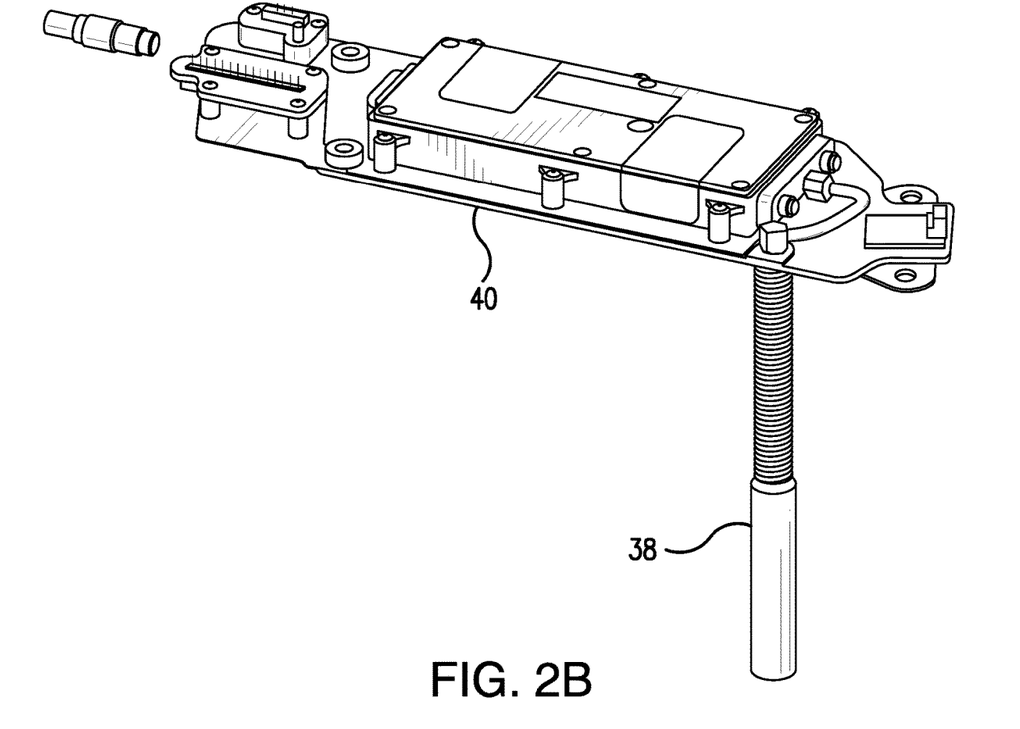
Figure 2C:
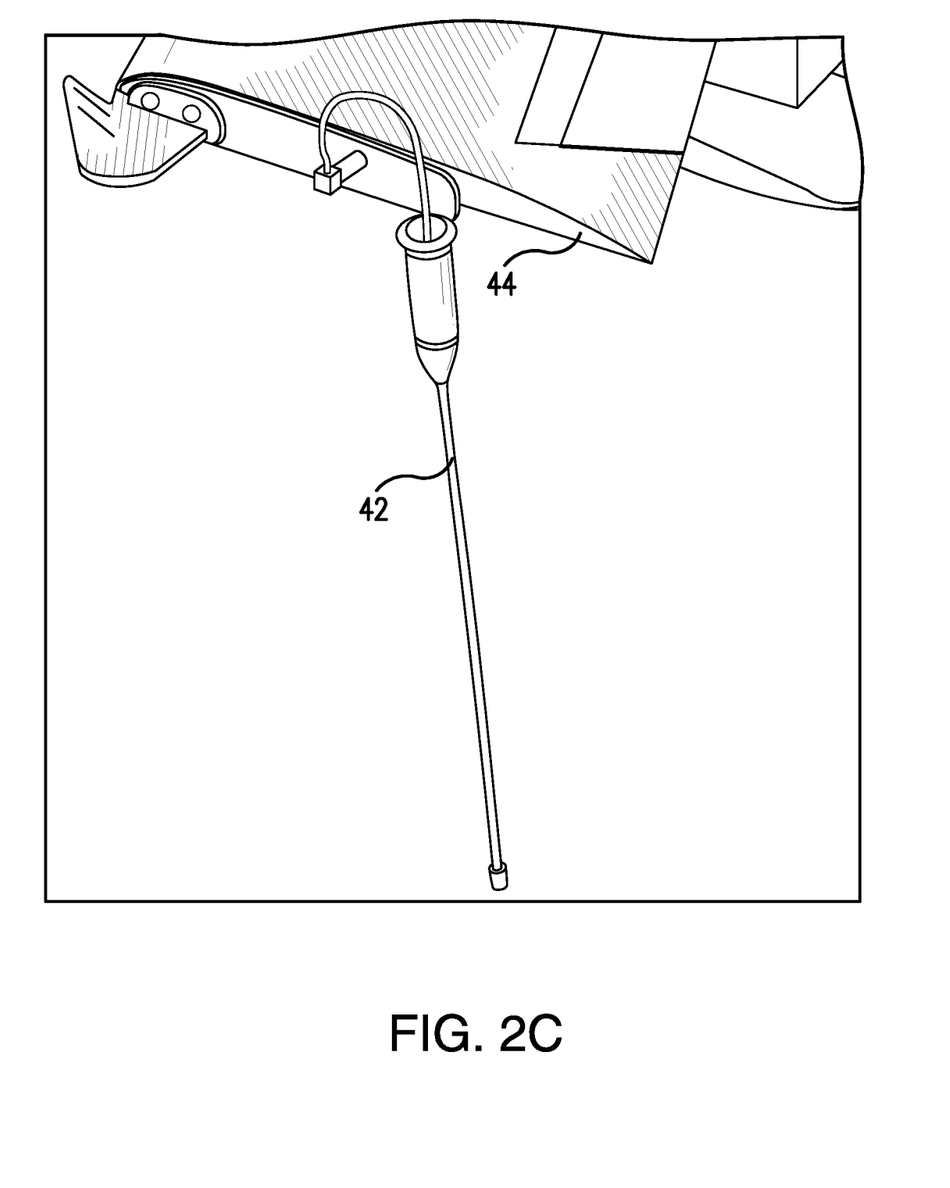

Turning now to FIGS. 2A-2C, another UAV 30 is shown in which antennas 32, 34, 36 are mounted underneath the fuselage of the UAV 30. Additionally, an antenna 38 (e.g., whip antenna) may be mounted on the underside of a wing tray and an antenna 42 may mounted in a downward position on a wingtip 44. In each of the illustrated configurations, the antennas 32, 34, 36, 38, 42 and their supporting airframe structures are susceptible to damage during various operations (e.g., during net or rope capture, transportation/handling/storage, "belly land" emergency maneuvers, and/or vertical takeoff and landing/VTOL on uneven terrain). As will be discussed in greater detail, the technology described herein provides for a frangible sensor assembly that detects electrical damage resulting from such operations and automatically generates an alert notification (e.g., maintenance alert, in-flight alert) in response to the damage.

Figure 3:
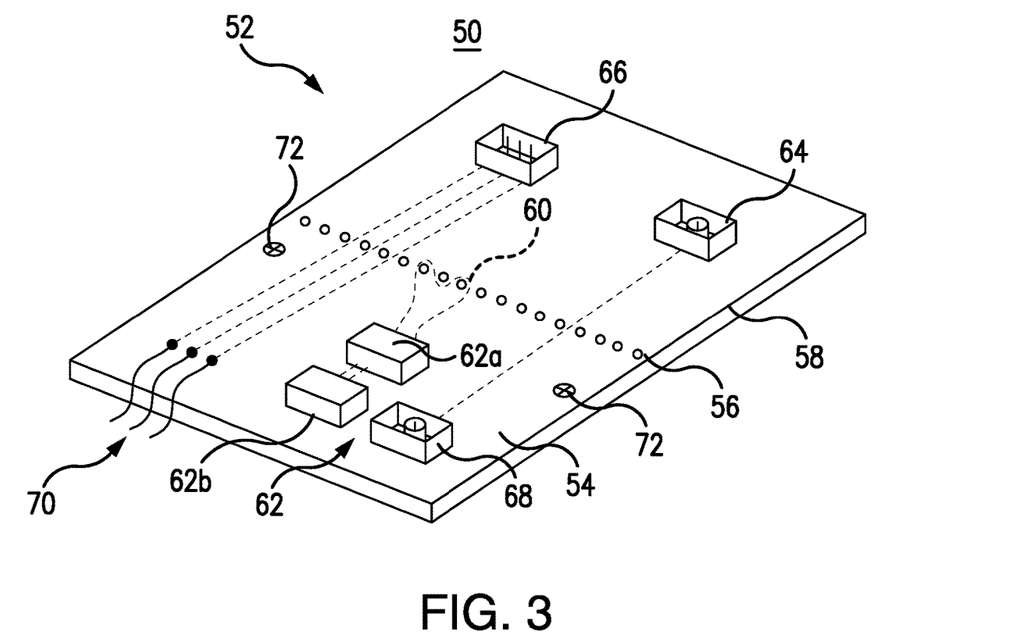
FIG. 3 is a perspective view of an example of a frangible sensor assembly according to an embodiment.

FIG. 3 shows a frangible sensor assembly 50 that may be incorporated into an airframe component such as, for example, the wing 24 and/or the winglet 28 of the UAV 30 (FIG. 1), the fuselage of the UAV 30 (FIG. 2A), the wing tray 40 (FIG. 2B) and/or the wingtip 44 (FIG. 2C), already discussed. The frangible sensor assembly 50 includes a circuit board 52 (e.g., printed circuit board/PCB) having a retained section 54, a frangible portion 56, and a detachable section 58 separated from the retained section 54 by the frangible portion 56. The frangible sensor assembly 50 also includes a conductive element 60 on the retained section 54 that spans the frangible portion 56. A sensor sub-assembly 62 (62a, 62b) is electrically coupled to the conductive element 60, wherein the sensor sub-assembly 62 is configured to monitor a continuity signal via the conductive element 60, detect a break of the frangible portion 56 based on the continuity signal, and generate an alert notification in response to the break of the frangible portion 56.

The illustrated detachable section 58 includes an antenna connector 64 (e.g., coaxial RF antenna connector) that exchanges signals with a corresponding RF connector 68 on the retained section 54 and a motor connector 66 (e.g., servo connector) that exchanges signals with a set of servo conductors 70 on the retained section 54. Thus, the antenna connector 64 might be electrically coupled with an antenna such as, for example, any one of the antennas 32, 34, 36 (FIG. 2A), the antenna 38 (FIG. 2B) and/or the antenna 42 (FIG. 2C), already discussed. Additionally, the motor connector 66 can be electrically coupled with a servo motor within the winglet 28 (FIG. 1), already discussed.

The alert notification may include a maintenance alert and/or an in-flight alert. For example, the maintenance alert can alert personnel of the presence of an antenna "frange" during ground recovery and maintenance operations. This solution might be particularly advantageous in inclement weather or darkness, when a mechanical failure is less likely to be noticed, or for parts that are difficult to inspect visually. Such an alert could trigger maintenance action or protocols such as replacing the broken part or subsystem, ensuring that part databases are updated to reflect a broken part, alert other operational units of the broken part, and so forth. The in-flight alert may support break detection during flight and alert personnel to perform emergency procedures or recovery actions. Such a detection could additionally trigger automated emergency procedures, such as initiating an autonomous navigation of the UAV to the location of a ground station or initial takeoff point for landing, upon detecting a break of the frangible portion that may cause an antenna connector to no longer be coupled to the antenna for enabling the UAV to receive navigation communications.

The sensor sub-assembly 62 may also be configured to re-route one or more signals associated with the detachable section 58 in response to the break of the frangible portion 56. For example, the sensor sub-assembly 62 might re-route signals from the RF connector 68 and/or the servo conductors 70 to a different antenna and/or motor within the UAV. Additionally, the sensor sub-assembly 62 can activate one or more back-up systems (e.g., slot patch antenna with some usable range antenna and/or back-up servo motor) associated with the detachable section 58 in response to the break of the frangible portion 56.

In one example, the sensor sub-assembly 62 includes a sensor component 62a (e.g., open circuit detector, monitoring circuit) and a processor 62b coupled to the sensor component 62a. Thus, the processor 62b may execute instructions (e.g., retrieved from non-volatile and/or volatile memory, not shown) to monitor the continuity signal, detect the break of the frangible portion 56 and generate the alert notification. Alternatively, the sensor component 62a and the processor 62b may be incorporated into a single component/chip. Although the illustrated frangible portion 56 includes surfaces defining a plurality of openings (e.g., mouse bites), other configurations such as, for example, notches, may be used to weaken the center of the circuit board 52. The illustrated circuit board 52 also includes screw mounts 72 to secure the frangible sensor assembly 50 to an interior structure of the UAV.

The circuit board 52 can be constructed of different substrate materials to optimize signal performance and mechanical break force characteristics. Additionally, the circuit board 52 may be single layer, double-layer, or multi-layer board. Moreover, the circuit board 52 include pass any combination or RF and/or low frequency or direct current (DC) signal conductors. In addition, the signals may be controlled impedance transmissions lines such as, for example, microstrip, stripline, coplanar waveguides, etc. In one embodiment, the ground plane of the circuit board 52 can be altered for matching, pattern optimization, or other benefits. Indeed, the circuit board 52 can be used as part of an overall RF shielding solution. The circuit board 52 may also contain other printed or discrete, soldered circuit elements such as, for example, an RF limiter, an RF filter, a balun (e.g., allowing balanced and unbalanced lines to be interfaced without disturbing the impedance arrangement of either line), a DC bias circuit, an RF switch or matching network, DC or low-frequency circuitry unrelated to the antenna, and so forth.

With further regard to the antenna connector 64, a multiplicity of antennas can be supported on one structure. Indeed, the antenna could be soldered or otherwise attached directly to the detachable section 58 of the circuit board 52, rather than through the antenna connector 64. Moreover, the antenna could be a printed structure on the circuit board 52 itself. For example, the printed structure might be a—dipole antenna, quarter wave patch antenna, slot antenna, and so forth.

Other techniques to detecting a break in the circuit board 52 are possible. For example, a wireless connection with low speed electrical signals, high speed electrical signals, RF signals, magnetic proximity sensing (e.g., Hall Effect sensor) or optical communications that interface with the board may be used. In one example, the frangible sensor assembly 50 includes conformal coating for environmental protection. Additionally, any apertures in the circuit board 52 (e.g., slots, mouse bites) could be covered with tape or other flexible membrane to promote moisture resistance and dust ingress. The frangible sensor assembly 50 therefore enhances performance at least to the extent that electrical damage is detected and prevented from jeopardizing current and/or subsequent missions. The frangible sensor assembly 50 also protects delicate and expensive equipment against damage and enhances vehicle survivability.

Figure 4:
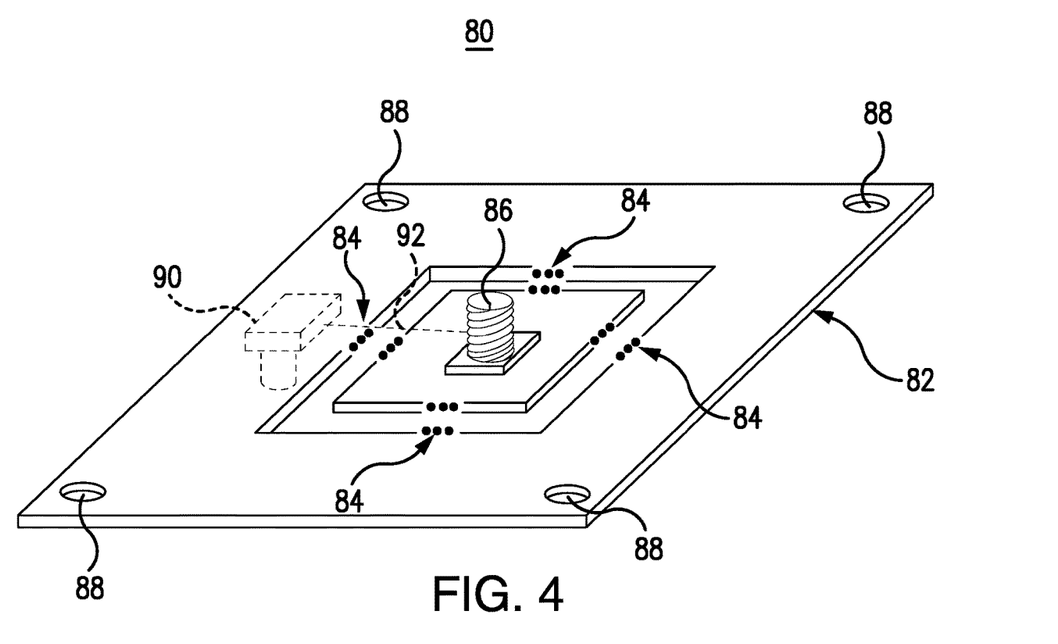
FIG. 4 is a perspective view of an example of a frangible sensor assembly according to another embodiment.

FIG. 4 shows another frangible sensor assembly 80 that may be incorporated into an airframe component such as, for example, the wing 24 and/or the winglet 28 of the UAV 30 (FIG. 1), the fuselage of the UAV 30 (FIG. 2A), the wing tray 40 (FIG. 2B) and/or the wingtip 44 (FIG. 2C), already discussed. The frangible sensor assembly 80 includes a circuit board 82 having mouse bite perforations 84 around a periphery of an RF connector 86 for an antenna and surfaces defining screw mounting holes 88. The frangible sensor assembly 80 may also include an RF connector 90 on an opposite side of the circuit board 82, wherein the RF connector 90 provides an electrical connection to a vehicle radio. In the illustrated example, an RF transmission line 92 couples the RF connectors 86, 90 to one another. Thus, the mouse bite perforations 84 enable the circuit board 82 to break across different axes (e.g., in response to forces applied at varying angles). Additionally, the RF transmission line 92 may be monitored to detect the breakage.

Figure 5:
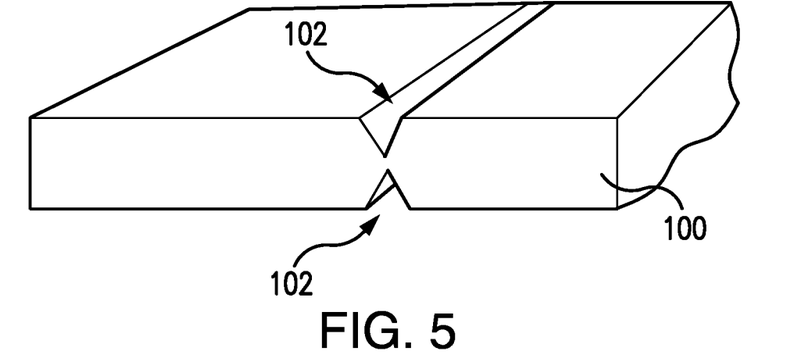
FIG. 5 is a perspective view of an example of a frangible portion of a circuit board that includes surfaces defining a plurality of notches.

FIG. 5 shows a frangible portion of a circuit board 100. In the illustrated example, the frangible portion includes surfaces defining a plurality of notches 102 (e.g., score lines) to weaken the circuit board 100 and facilitate breakage, while still permitting a conductive element to span the frangible portion for sensing purposes. Additionally, servo and datalink RF signals may pass through the frangible portion.

Figure 6:
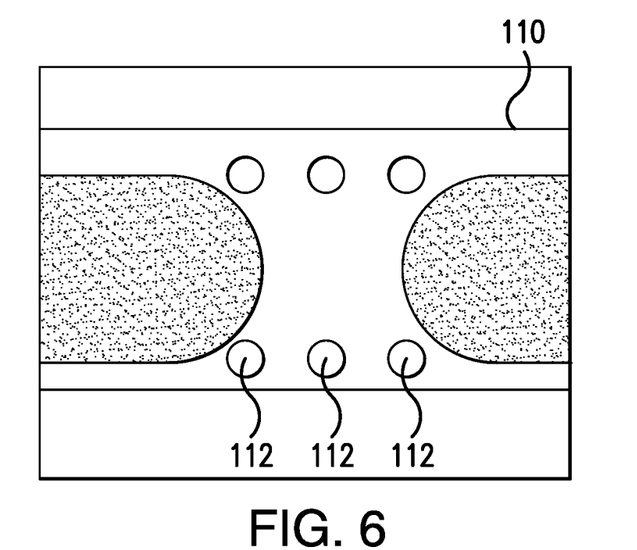
FIG. 6 is a plan view of an example of a frangible portion of a circuit board that includes surfaces defining a plurality of openings.

FIG. 6 shows another frangible portion of a circuit board 110. In the illustrated example, the frangible (e.g., tab) portion includes surfaces defining a plurality of openings 112 (e.g., mouse bites) to weaken the circuit board 110 and facilitate breakage, while still permitting a conductive element to span the frangible portion for sensing purposes. Additionally, servo and datalink RF signals may pass through the frangible portion.

Figure 7:
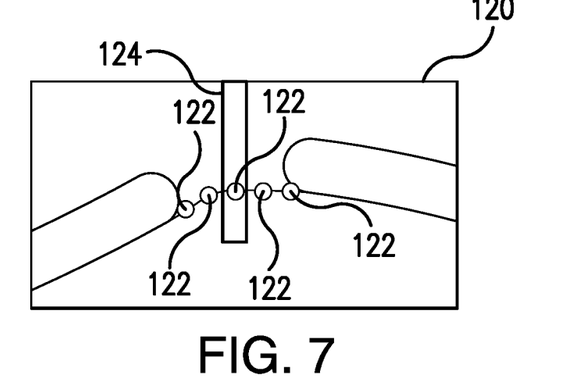
FIG. 7 is a plan view of an example of a conductive element that spans a frangible portion of a circuit board.

FIG. 7 shows another frangible portion of a circuit board 120. In the illustrated example, the frangible portion includes surfaces defining a plurality of openings 122 (e.g., mouse bites) to weaken the circuit board 120 and facilitate breakage, while still permitting a conductive element 124 (e.g., copper loop) to span the frangible portion for sensing purposes. Additionally, servo and datalink RF signals may pass through the frangible portion.

Figure 8:
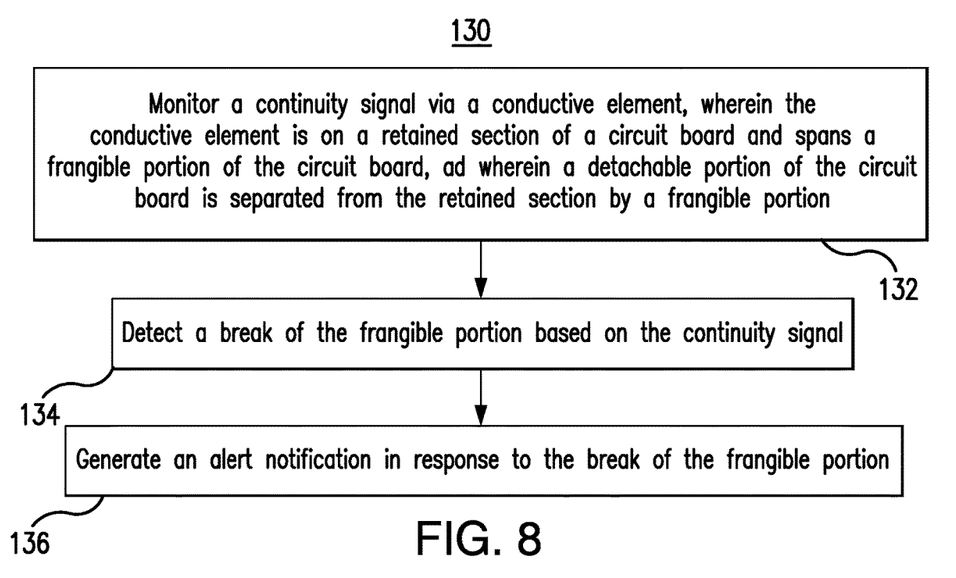
FIG. 8 is a flowchart of an example of a method of operating a processor according to an embodiment.

FIG. 8 shows a method 130 of operating a processor. The method 130 may generally be implemented in a processor such as, for example, the processor 62b (FIG. 3), already discussed. More particularly, the method 130 may be implemented in one or more modules as a set of logic instructions stored in a machine- or computer-readable storage medium such as random access memory (RAM), read only memory (ROM), programmable ROM (PROM), firmware, flash memory, etc., in hardware, or any combination thereof. For example, hardware implementations may include configurable logic, fixed-functionality logic, or any combination thereof. Examples of configurable logic (e.g., configurable hardware) include suitably configured programmable logic arrays (PLAs), field programmable gate arrays (FPGAs), complex programmable logic devices (CPLDs), and general purpose microprocessors. Examples of fixed-functionality logic (e.g., fixed-functionality hardware) include suitably configured application specific integrated circuits (ASICs), combinational logic circuits, and sequential logic circuits. The configurable or fixed-functionality logic can be implemented with complementary metal oxide semiconductor (CMOS) logic circuits, transistor-transistor logic (TTL) logic circuits, or other circuits.

Illustrated processing block 132 provides for monitoring a continuity signal via a conductive element, wherein the conductive element is on a retained section of a circuit board and spans a frangible portion of the circuit board, and wherein a detachable portion of the circuit board is separated from the retained section by the frangible portion. Block 134 detects a break of the frangible portion based on the continuity signal. For example, block 134 might detect an open circuit with respect to the conductive element. Additionally, block 136 generates an alert notification in response to the break of the frangible portion. In one example, the alert notification includes one or more of a maintenance alert or an in-flight alert. Block 136 may also re-route one or more signals associated with the detachable section in response to the break of the frangible portion. Moreover, block 136 can activate one or more back-up systems associated with the detachable section in response to the break of the frangible portion. Block 136 may also initiate other platform responses such as a change of flight path, change of operational modes, etc. The method 130 therefore enhances performance at least to the extent that electrical damage is detected and prevented from jeopardizing current and/or subsequent missions.

Figure 9:
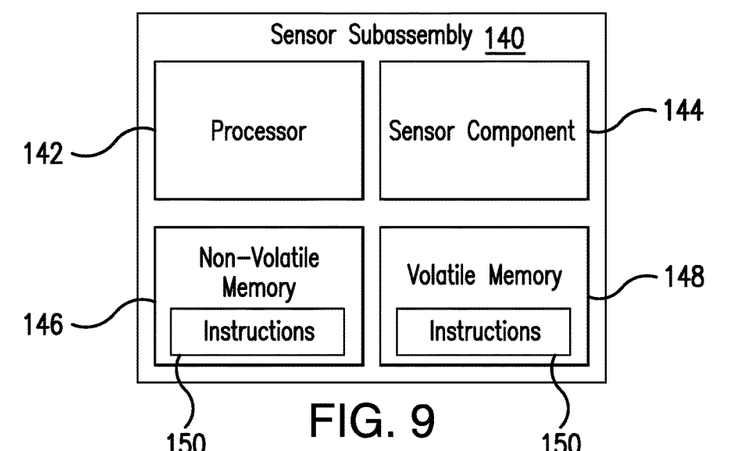
FIG. 9 is a block diagram of an example of a sensor sub-assembly according to an embodiment.

FIG. 9 shows a sensor sub-assembly 140 that may be readily substituted for the sensor sub-assembly 62 (FIG. 3), already discussed. The illustrated sensor sub-assembly 140 includes a processor 142, a sensor component 144, non-volatile memory (NVM, e.g., flash memory) 146, and volatile memory (e.g., dynamic RAM/DRAM) 148. In an embodiment, the processor 142 executes instructions 150 retrieved from the NVM 146 and/or the volatile memory 148, wherein execution of the instructions 150 causes the processor to perform one or more aspects of the method 130 (FIG. 8). Thus, the processor 142 uses the sensor component 144 to monitor a continuity signal via a conductive element, wherein the conductive element is on a retained section of a circuit board and spans a frangible portion of the circuit board, and wherein a detachable portion of the circuit board is separated from the retained section by the frangible portion. The processor 142 also detects a break of the frangible portion based on the continuity signal and generates an alert notification in response to the break of the frangible portion.

Figure 10:
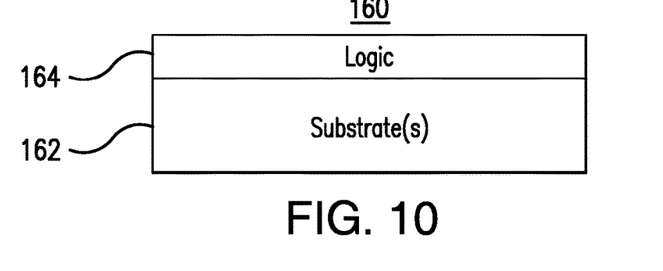
FIG. 10 is an illustration of an example of a semiconductor apparatus according to an embodiment.

FIG. 10 shows a semiconductor apparatus 160 that may be readily substituted for the processor 142 (FIG. 9) and/or the processor 62b (FIG. 3), already discussed. (e.g., chip, die, package). The illustrated semiconductor apparatus 160 includes one or more substrates 162 (e.g., silicon, sapphire, gallium arsenide) and logic 164 (e.g., transistor array and other integrated circuit/IC components) coupled to the substrate(s) 162. In an embodiment, the logic 164 implements one or more aspects of the method 130 (FIG. 8), already discussed.

The logic 164 may be implemented at least partly in configurable or fixed-functionality hardware. In one example, the logic 164 includes transistor channel regions that are positioned (e.g., embedded) within the substrate(s) 162. Thus, the interface between the logic 164 and the substrate(s) 162 may not be an abrupt junction. The logic 164 may also be considered to include an epitaxial layer that is grown on an initial wafer of the substrate(s) 162.

ADDITIONAL NOTES AND EXAMPLES

Example one includes an unmanned aerial vehicle (UAV) comprising a fuselage, and a plurality of wings, at least one of the plurality of wings including a frangible sensor assembly comprising a circuit board including a retained section, a frangible portion, and a detachable section separated from the retained section by the frangible portion, a conductive element on the retained section that spans the frangible portion, and a sensor sub-assembly electrically coupled to the conductive element, wherein the sensor sub-assembly is to monitor a continuity signal via the conductive element, detect a break of the frangible portion based on the continuity signal, and generate an alert notification in response to the break of the frangible portion.

Example two includes the UAV of Example one, wherein the alert notification is one or more of a maintenance alert or an in-flight alert.

Example three includes the UAV of Example one, wherein the sensor sub-assembly is further to re-route one or more signals associated with the detachable section in response to the break of the frangible portion.

Example four includes the UAV of Example one, wherein the sensor sub-assembly is further to activate one or more back-up systems associated with the detachable section in response to the break of the frangible portion.

Example five includes the UAV of Example one, wherein the detachable section includes one or more of an antenna connector or a motor connector.

Example six includes the UAV of Example one, wherein the frangible portion includes surfaces defining one or more notches.

Example seven includes the UAV of Example one, wherein the frangible portion includes surfaces defining a plurality of openings.

Example eight includes the UAV of Example one, wherein the sensor sub-assembly includes a sensor component and a processor coupled to the sensor component.

Example nine includes a frangible sensor assembly comprising a circuit board including a retained section, a frangible portion, and a detachable section separated from the retained section by the frangible portion, a conductive element on the retained section that spans the frangible portion, and a sensor sub-assembly electrically coupled to the conductive element, wherein the sensor sub-assembly is to monitor a continuity signal via the conductive element, detect a break of the frangible portion based on the continuity signal, and generate an alert notification in response to the break of the frangible portion.

Example ten includes the frangible sensor assembly of Example nine, wherein the alert notification is one or more of a maintenance alert or an in-flight alert.

Example eleven includes the frangible sensor assembly of Example nine, wherein the sensor sub-assembly is further to re-route one or more signals associated with the detachable section in response to the break of the frangible portion.

Example twelve includes the frangible sensor assembly of Example nine, wherein the sensor sub-assembly is further to activate one or more back-up systems associated with the detachable section in response to the break of the frangible portion.

Example thirteen includes the frangible sensor assembly of Example nine, wherein the detachable section includes one or more of an antenna connector or a motor connector.

Example fourteen includes the frangible sensor assembly of Example nine, wherein the frangible portion includes surfaces defining one or more notches.

Example fifteen includes the frangible sensor assembly of Example nine, wherein the frangible portion includes surfaces defining a plurality of openings.

Example sixteen includes the frangible sensor assembly of Example nine, wherein the sensor sub-assembly includes a sensor component and a processor coupled to the sensor component.

Example seventeen includes at least one computer readable storage medium comprising a set of instructions, which when executed by a processor, cause the processor to monitor a continuity signal via a conductive element, wherein the conductive element is on a retained section of a circuit board and spans a frangible portion of the circuit board, and wherein a detachable section of the circuit board is separated from the retained section by the frangible portion, detect a break of the frangible portion based on the continuity signal, and generate an alert notification in response to the break of the frangible portion.

Example eighteen includes the at least one computer readable storage medium of Example seventeen, wherein the alert notification is one or more of a maintenance alert or an in-flight alert.

Example nineteen includes the at least one computer readable storage medium of Example seventeen, wherein the instructions, when executed, further cause the processor to re-route one or more signals associated with the detachable section in response to the break of the frangible portion.

Example twenty includes the at least one computer readable storage medium of Example seventeen, wherein the instructions, when executed, further cause the processor to activate one or more back-up systems associated with the detachable section in response to the break of the frangible portion.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD (solid state drive)/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. An unmanned aerial vehicle (UAV) comprising:
    a fuselage; and
    a plurality of wings, at least one of the plurality of wings including a frangible sensor assembly comprising:
        a circuit board including a retained section, a frangible portion, and a detachable section separated from the retained section by the frangible portion, wherein the detachable section includes an antenna connector exchanging first signals with one or more of a radio frequency (RF) connector or a motor connector that exchanges second signals with a servo conductor, wherein the antenna connector is electrically coupled with a first antenna,
        a conductive element on the retained section that spans the frangible portion, and
        a sensor sub-assembly electrically coupled to the conductive element, wherein the sensor sub-assembly is to monitor a continuity signal via the conductive element, detect a break of the frangible portion based on the continuity signal, generate an alert notification in response to the break of the frangible portion, and re-route signals associated with the detachable section in response to the break of the frangible portion being detected by re-routing one or more of the first or second signals to one or more of a second antenna or a motor.

2. The UAV of claim 1, wherein the alert notification is one or more of a maintenance alert or an in-flight alert.

3. The UAV of claim 1, wherein the sensor sub-assembly is further to activate one or more back-up systems associated with the detachable section in response to the break of the frangible portion.

4. The UAV of claim 1, wherein the detachable section includes one or more of an antenna connector or a motor connector.

5. The UAV of claim 1, wherein the frangible portion includes surfaces defining one or more notches.

6. The UAV of claim 1, wherein the frangible portion includes surfaces defining a plurality of openings.

7. The UAV of claim 1, wherein the sensor sub-assembly includes a sensor component and a processor coupled to the sensor component.

8. A frangible sensor assembly comprising:
    a circuit board including a retained section, a frangible portion, and a detachable section separated from the retained section by the frangible portion, wherein the detachable section includes an antenna connector exchanging first signals with one or more of a radio frequency (RF) connector or a motor connector that exchanges second signals with a servo conductor, wherein the antenna connector is electrically coupled with a first antenna;
    a conductive element on the retained section that spans the frangible portion; and
    a sensor sub-assembly electrically coupled to the conductive element, wherein the sensor sub-assembly is to monitor a continuity signal via the conductive element, detect a break of the frangible portion based on the continuity signal, generate an alert notification in response to the break of the frangible portion, and re-route signals associated with the detachable section in response to the break of the frangible portion being detected by re-routing one or more of the first or second signals to one or more of a second antenna or a motor.

9. The frangible sensor assembly of claim 8, wherein the alert notification is one or more of a maintenance alert or an in-flight alert.

10. The frangible sensor assembly of claim 8, wherein the sensor sub-assembly is further to activate one or more back-up systems associated with the detachable section in response to the break of the frangible portion.

11. The frangible sensor assembly of claim 8, wherein the detachable section includes one or more of an antenna connector or a motor connector.

12. The frangible sensor assembly of claim 8, wherein the frangible portion includes surfaces defining one or more notches.

13. The frangible sensor assembly of claim 8, wherein the frangible portion includes surfaces defining a plurality of openings.

14. The frangible sensor assembly of claim 8, wherein the sensor sub-assembly includes a sensor component and a processor coupled to the sensor component.

15. At least one non-transitory computer readable storage medium comprising a set of instructions, which when executed by a processor, cause the processor to:
    monitor a continuity signal via a conductive element, wherein the conductive element is on a retained section of a circuit board and spans a frangible portion of the circuit board, and wherein a detachable section of the circuit board is separated from the retained section by the frangible portion;
    exchanging, with an antenna connector on the detachable section, first signals with one or more of a radio frequency (RF) connector or a motor connector that exchanges second signals with a servo conductor, wherein the antenna connector is electrically coupled with a first antenna;
    detect a break of the frangible portion based on the continuity signal;
    generate an alert notification in response to the break of the frangible portion; and
    re-route signals associated with the detachable section in response to the break of the frangible portion being detected by re-routing one or more of the first or second signals to one or more of a second antenna or a motor.

16. The at least one non-transitory computer readable storage medium of claim 15, wherein the alert notification is one or more of a maintenance alert or an in-flight alert.

17. The at least one non-transitory computer readable storage medium of claim 15, wherein the instructions, when executed, further cause the processor to activate one or more back-up systems associated with the detachable section in response to the break of the frangible portion.

18. The UAV of claim 1, wherein the first and second signals are rerouted to one or more of the second antenna or the motor.

19. The frangible sensor assembly of claim 8, wherein the first and second signals are rerouted to one or more of the second antenna or the motor.

20. The at least one non-transitory computer readable storage medium of claim 15, wherein the first and second signals are rerouted to one or more of the second antenna or the motor.

* * * * *